United States Patent
Park et al.

(10) Patent No.: US 9,355,922 B2
(45) Date of Patent: May 31, 2016

(54) SYSTEMS AND METHODS FOR INTERNAL SURFACE CONDITIONING IN PLASMA PROCESSING EQUIPMENT

(71) Applicant: Applied Materials, Inc., Santa Clara, CA (US)

(72) Inventors: Soonam Park, Sunnyvale, CA (US); Yufei Zhu, Sunnyvale, CA (US); Edwin C. Suarez, Fremont, CA (US); Nitin K. Ingle, San Jose, CA (US); Dmitry Lubomirsky, Cupertino, CA (US); Jiayin Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/514,213

(22) Filed: Oct. 14, 2014

(65) Prior Publication Data
US 2016/0104648 A1 Apr. 14, 2016

(51) Int. Cl.
*H01L 21/3065* (2006.01)
*H01L 21/66* (2006.01)
*H01L 21/67* (2006.01)

(52) U.S. Cl.
CPC ............ *H01L 22/26* (2013.01); *H01L 21/3065* (2013.01); *H01L 21/67069* (2013.01); *H01L 21/67253* (2013.01)

(58) Field of Classification Search
USPC .................................. 216/59, 60, 67; 438/905
See application file for complete search history.

(56) References Cited

U.S. PATENT DOCUMENTS

| | | |
|---|---|---|
| 4,374,698 A | 2/1983 | Sanders et al. |
| 4,838,990 A | 6/1989 | Jucha et al. |
| 4,946,903 A | 8/1990 | Gardella et al. |
| 5,248,371 A | 9/1993 | Maher et al. |
| 5,279,669 A | 1/1994 | Lee |
| 5,753,886 A | 5/1998 | Iwamura et al. |
| 5,926,737 A | 7/1999 | Ameen et al. |
| 5,948,702 A | 9/1999 | Rotondaro |
| 6,120,640 A | 9/2000 | Shih et al. |
| 6,303,044 B1 * | 10/2001 | Koemtzopoulos et al. ................. H01J 37/32862 134/1.1 |
| 6,379,575 B1 * | 4/2002 | Yin ........................ B08B 7/0035 134/1.1 |
| 7,500,445 B2 | 3/2009 | Zhao et al. |
| 7,790,634 B2 | 9/2010 | Munro et al. |
| 7,825,038 B2 | 11/2010 | Ingle et al. |
| 7,989,365 B2 | 8/2011 | Park et al. |
| 8,427,067 B2 | 4/2013 | Espiau et al. |
| 9,023,732 B2 | 5/2015 | Wang et al. |
| 9,093,371 B2 | 7/2015 | Wang et al. |
| 9,144,147 B2 | 9/2015 | Yang et al. |

(Continued)

*Primary Examiner* — Shamim Ahmed
(74) *Attorney, Agent, or Firm* — Kilpatrick Townsend & Stockton LLP

(57) ABSTRACT

A method of conditioning internal surfaces of a plasma source includes flowing first source gases into a plasma generation cavity of the plasma source that is enclosed at least in part by the internal surfaces. Upon transmitting power into the plasma generation cavity, the first source gases ignite to form a first plasma, producing first plasma products, portions of which adhere to the internal surfaces. The method further includes flowing the first plasma products out of the plasma generation cavity toward a process chamber where a workpiece is processed by the first plasma products, flowing second source gases into the plasma generation cavity. Upon transmitting power into the plasma generation cavity, the second source gases ignite to form a second plasma, producing second plasma products that at least partially remove the portions of the first plasma products from the internal surfaces.

17 Claims, 10 Drawing Sheets

(56) References Cited

U.S. PATENT DOCUMENTS

| | | |
|---|---|---|
| 9,190,293 B2 | 11/2015 | Wang et al. |
| 9,209,012 B2 | 12/2015 | Chen et al. |
| 9,245,762 B2 | 1/2016 | Zhang et al. |
| 2001/0034106 A1 | 10/2001 | Moise et al. |
| 2002/0106845 A1 | 8/2002 | Chao et al. |
| 2003/0113451 A1 | 6/2003 | Mayer et al. |
| 2003/0129850 A1 | 7/2003 | Olgado et al. |
| 2003/0140851 A1 | 7/2003 | Janakiraman et al. |
| 2003/0141018 A1 | 7/2003 | Stevens et al. |
| 2003/0143328 A1 | 7/2003 | Chen et al. |
| 2004/0007176 A1 | 1/2004 | Janakiraman et al. |
| 2004/0033684 A1 | 2/2004 | Li |
| 2004/0060514 A1 | 4/2004 | Janakiraman et al. |
| 2004/0083964 A1 | 5/2004 | Ingle et al. |
| 2004/0129671 A1 | 7/2004 | Ji et al. |
| 2004/0157444 A1 | 8/2004 | Chiu |
| 2004/0166695 A1 | 8/2004 | Yuan et al. |
| 2004/0200499 A1 | 10/2004 | Harvey |
| 2004/0216844 A1 | 11/2004 | Janakiraman et al. |
| 2004/0219737 A1 | 11/2004 | Quon |
| 2004/0231588 A1 | 11/2004 | Mayer et al. |
| 2004/0263827 A1* | 12/2004 | Xu .................... G01N 21/68 356/72 |
| 2005/0051094 A1 | 3/2005 | Schaepkens et al. |
| 2005/0064730 A1 | 3/2005 | Ingle et al. |
| 2005/0079706 A1 | 4/2005 | Kumar et al. |
| 2005/0085031 A1 | 4/2005 | Lopatin et al. |
| 2005/0101130 A1 | 5/2005 | Lopatin et al. |
| 2005/0136684 A1 | 6/2005 | Mukai et al. |
| 2005/0142895 A1 | 6/2005 | Ingle et al. |
| 2005/0167394 A1 | 8/2005 | Liu et al. |
| 2005/0196967 A1 | 9/2005 | Savas et al. |
| 2005/0199489 A1 | 9/2005 | Stevens et al. |
| 2005/0255667 A1 | 11/2005 | Arghavani et al. |
| 2006/0005856 A1 | 1/2006 | Sun et al. |
| 2006/0030165 A1 | 2/2006 | Ingle et al. |
| 2006/0033678 A1 | 2/2006 | Lubomirsky et al. |
| 2006/0046427 A1 | 3/2006 | Ingle et al. |
| 2006/0118765 A1 | 6/2006 | Lubomirsky |
| 2006/0148273 A1 | 7/2006 | Ingle et al. |
| 2006/0252265 A1 | 11/2006 | Jin et al. |
| 2006/0264062 A1 | 11/2006 | Ingle et al. |
| 2007/0000897 A1 | 1/2007 | Ingle et al. |
| 2007/0004201 A1 | 1/2007 | Lubomirsky et al. |
| 2007/0024362 A1 | 2/2007 | Radomski et al. |
| 2007/0062453 A1 | 3/2007 | Ishikawa |
| 2007/0111519 A1 | 5/2007 | Lubomirsky et al. |
| 2007/0154838 A1 | 7/2007 | Lee |
| 2007/0212847 A1 | 9/2007 | Ingle et al. |
| 2007/0212850 A1 | 9/2007 | Ingle et al. |
| 2007/0227554 A1 | 10/2007 | Satoh et al. |
| 2007/0238199 A1* | 10/2007 | Yamashita ............ B08B 7/00 438/5 |
| 2007/0259467 A1 | 11/2007 | Tweet et al. |
| 2007/0277734 A1 | 12/2007 | Lubomirsky et al. |
| 2007/0281106 A1 | 12/2007 | Lubomirsky et al. |
| 2007/0287292 A1 | 12/2007 | Li et al. |
| 2007/0289534 A1 | 12/2007 | Lubomirsky et al. |
| 2007/0298585 A1 | 12/2007 | Lubomirsky et al. |
| 2008/0020570 A1 | 1/2008 | Naik |
| 2008/0029484 A1 | 2/2008 | Park et al. |
| 2008/0063810 A1 | 3/2008 | Park et al. |
| 2008/0102570 A1 | 5/2008 | Fisher et al. |
| 2008/0102640 A1 | 5/2008 | Hassan et al. |
| 2008/0115726 A1 | 5/2008 | Ingle et al. |
| 2008/0121179 A1 | 5/2008 | Park et al. |
| 2008/0124944 A1 | 5/2008 | Park et al. |
| 2008/0157225 A1 | 7/2008 | Datta et al. |
| 2008/0182382 A1 | 7/2008 | Ingle et al. |
| 2008/0185284 A1 | 8/2008 | Chen et al. |
| 2008/0188087 A1 | 8/2008 | Chen et al. |
| 2008/0188090 A1 | 8/2008 | Chen et al. |
| 2008/0311753 A1 | 12/2008 | Zheng et al. |
| 2008/0311754 A1 | 12/2008 | Chandrasekaran et al. |
| 2009/0031953 A1 | 2/2009 | Ingle et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0093129 A1 | 4/2009 | Park et al. |
| 2009/0104789 A1 | 4/2009 | Mallick et al. |
| 2009/0120364 A1 | 5/2009 | Suarez et al. |
| 2009/0120368 A1 | 5/2009 | Lubomirsky et al. |
| 2009/0120464 A1 | 5/2009 | Rasheed et al. |
| 2009/0120584 A1 | 5/2009 | Lubomirsky et al. |
| 2009/0261276 A1 | 10/2009 | Lubomirsky et al. |
| 2009/0266299 A1 | 10/2009 | Rasheed et al. |
| 2009/0277587 A1 | 11/2009 | Lubomirsky et al. |
| 2009/0280650 A1 | 11/2009 | Lubomirsky et al. |
| 2009/0283217 A1 | 11/2009 | Lubomirsky et al. |
| 2010/0006032 A1 | 1/2010 | Hinckley et al. |
| 2010/0022067 A1 | 1/2010 | Tang et al. |
| 2010/0041207 A1 | 2/2010 | Lee et al. |
| 2010/0048028 A1 | 2/2010 | Rasheed et al. |
| 2010/0059724 A1 | 3/2010 | Lubomirsky et al. |
| 2010/0098882 A1 | 4/2010 | Lubomirsky et al. |
| 2010/0129982 A1 | 5/2010 | Kao et al. |
| 2010/0159711 A1 | 6/2010 | Venkataraman et al. |
| 2011/0011338 A1 | 1/2011 | Chuc et al. |
| 2011/0034035 A1 | 2/2011 | Liang et al. |
| 2011/0034039 A1 | 2/2011 | Liang et al. |
| 2011/0053380 A1 | 3/2011 | Sapre et al. |
| 2011/0061810 A1 | 3/2011 | Ganguly et al. |
| 2011/0081782 A1 | 4/2011 | Liang et al. |
| 2011/0114601 A1 | 5/2011 | Lubomirsky et al. |
| 2011/0115378 A1 | 5/2011 | Lubomirsky et al. |
| 2011/0129616 A1 | 6/2011 | Ingle et al. |
| 2011/0136347 A1 | 6/2011 | Kovarsky et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0159213 A1 | 6/2011 | Cai et al. |
| 2011/0159703 A1 | 6/2011 | Liang et al. |
| 2011/0165781 A1 | 7/2011 | Liang et al. |
| 2011/0197814 A1 | 8/2011 | Baek et al. |
| 2011/0212620 A1 | 9/2011 | Liang et al. |
| 2011/0217851 A1 | 9/2011 | Liang et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003840 A1 | 1/2012 | Wang et al. |
| 2012/0009796 A1 | 1/2012 | Cui et al. |
| 2012/0052683 A1 | 3/2012 | Kim et al. |
| 2012/0070957 A1 | 3/2012 | Mallick et al. |
| 2012/0073501 A1 | 3/2012 | Lubomirsky et al. |
| 2012/0074126 A1 | 3/2012 | Bang et al. |
| 2012/0083133 A1 | 4/2012 | Solis et al. |
| 2012/0088193 A1 | 4/2012 | Weidman et al. |
| 2012/0142192 A1 | 6/2012 | Li et al. |
| 2012/0142198 A1 | 6/2012 | Wang et al. |
| 2012/0145079 A1 | 6/2012 | Lubomirsky et al. |
| 2012/0177846 A1 | 7/2012 | Li et al. |
| 2012/0180954 A1 | 7/2012 | Yang et al. |
| 2012/0193456 A1 | 8/2012 | Lubomirsky et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0247670 A1 | 10/2012 | Dobashi et al. |
| 2012/0269989 A1 | 10/2012 | Liang et al. |
| 2012/0309205 A1 | 12/2012 | Wang et al. |
| 2013/0023122 A1 | 1/2013 | Nemani et al. |
| 2013/0023124 A1 | 1/2013 | Nemani et al. |
| 2013/0034968 A1 | 2/2013 | Zhang et al. |
| 2013/0045605 A1 | 2/2013 | Wang et al. |
| 2013/0048605 A1 | 2/2013 | Sapre et al. |
| 2013/0052827 A1 | 2/2013 | Wang et al. |
| 2013/0059440 A1 | 3/2013 | Wang et al. |
| 2013/0065398 A1 | 3/2013 | Ohsawa et al. |
| 2013/0082197 A1 | 4/2013 | Yang et al. |
| 2013/0084711 A1 | 4/2013 | Liang et al. |
| 2013/0089988 A1 | 4/2013 | Wang et al. |
| 2013/0105085 A1 | 5/2013 | Yousif et al. |
| 2013/0105086 A1 | 5/2013 | Banna et al. |

(56) References Cited

U.S. PATENT DOCUMENTS

| | | |
|---|---|---|
| 2013/0105088 A1 | 5/2013 | Pal et al. |
| 2013/0105303 A1 | 5/2013 | Lubomirsky et al. |
| 2013/0107415 A1 | 5/2013 | Banna et al. |
| 2013/0109190 A1 | 5/2013 | Lill et al. |
| 2013/0119016 A1* | 5/2013 | Kagoshima ....... H01J 37/32935 216/59 |
| 2013/0130506 A1 | 5/2013 | Wang et al. |
| 2013/0130507 A1 | 5/2013 | Wang et al. |
| 2013/0149462 A1 | 6/2013 | Liang et al. |
| 2013/0177847 A1 | 7/2013 | Catterjee et al. |
| 2013/0193108 A1* | 8/2013 | Zheng ................... C23C 14/54 216/59 |
| 2013/0207513 A1 | 8/2013 | Lubomirsky et al. |
| 2013/0216821 A1 | 8/2013 | Sun et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0260533 A1 | 10/2013 | Sapre et al. |
| 2013/0267079 A1 | 10/2013 | Underwood et al. |
| 2013/0273313 A1 | 10/2013 | Sun et al. |
| 2013/0273327 A1 | 10/2013 | Sun et al. |
| 2013/0276980 A1 | 10/2013 | Lubomirsky et al. |
| 2013/0279066 A1 | 10/2013 | Lubomirsky et al. |
| 2013/0284373 A1 | 10/2013 | Sun et al. |
| 2013/0284374 A1 | 10/2013 | Lubomirsky et al. |
| 2013/0288483 A1 | 10/2013 | Sadjadi et al. |
| 2013/0298942 A1 | 11/2013 | Ren et al. |
| 2013/0306758 A1 | 11/2013 | Park et al. |
| 2013/0337655 A1 | 12/2013 | Lee et al. |
| 2014/0017898 A1 | 1/2014 | Nemani et al. |
| 2014/0030486 A1 | 1/2014 | Sun et al. |
| 2014/0030533 A1 | 1/2014 | Sun et al. |
| 2014/0045342 A1 | 2/2014 | Mallick et al. |
| 2014/0051264 A1 | 2/2014 | Mallick et al. |
| 2014/0057447 A1 | 2/2014 | Yang et al. |
| 2014/0073144 A1 | 3/2014 | Chatterjee et al. |
| 2014/0080308 A1 | 3/2014 | Chen et al. |
| 2014/0080309 A1 | 3/2014 | Park et al. |
| 2014/0080310 A1 | 3/2014 | Chen et al. |
| 2014/0083362 A1 | 3/2014 | Lubomirsky et al. |
| 2014/0097270 A1 | 4/2014 | Liang et al. |
| 2014/0099794 A1* | 4/2014 | Ingle ................. H01J 37/32357 438/710 |
| 2014/0120726 A1 | 5/2014 | Nemani et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0154889 A1 | 6/2014 | Wang et al. |
| 2014/0166617 A1 | 6/2014 | Chen et al. |
| 2014/0177123 A1 | 6/2014 | Thach et al. |
| 2014/0179111 A1 | 6/2014 | Liu et al. |
| 2014/0190410 A1 | 7/2014 | Kim |
| 2014/0199850 A1 | 7/2014 | Kim et al. |
| 2014/0199851 A1 | 7/2014 | Nemani et al. |
| 2014/0209027 A1 | 7/2014 | Lubomirsky et al. |
| 2014/0209596 A1 | 7/2014 | Lubomirsky et al. |
| 2014/0213070 A1 | 7/2014 | Hong et al. |
| 2014/0225504 A1 | 8/2014 | Kaneko et al. |
| 2014/0227881 A1 | 8/2014 | Lubomirsky et al. |
| 2014/0231384 A1 | 8/2014 | Underwood et al. |
| 2014/0248754 A1 | 9/2014 | Thadani et al. |
| 2014/0248780 A1 | 9/2014 | Ingle et al. |
| 2014/0252134 A1 | 9/2014 | Chen et al. |
| 2014/0256131 A1 | 9/2014 | Wang et al. |
| 2014/0262038 A1 | 9/2014 | Wang et al. |
| 2014/0263173 A1 | 9/2014 | Rosslee et al. |
| 2014/0268083 A1 | 9/2014 | Barman et al. |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273489 A1 | 9/2014 | Wang et al. |
| 2014/0273491 A1 | 9/2014 | Zhang et al. |
| 2014/0302688 A1 | 10/2014 | Underwood et al. |
| 2014/0302690 A1 | 10/2014 | Underwood et al. |
| 2014/0308816 A1 | 10/2014 | Wang et al. |
| 2014/0308818 A1 | 10/2014 | Wang et al. |
| 2014/0329027 A1 | 11/2014 | Liang et al. |
| 2014/0366953 A1 | 12/2014 | Lee et al. |
| 2015/0013793 A1 | 1/2015 | Chuc et al. |
| 2015/0031211 A1 | 1/2015 | Sapre et al. |
| 2015/0047786 A1 | 2/2015 | Lubomirsky et al. |
| 2015/0060265 A1 | 3/2015 | Cho et al. |
| 2015/0064809 A1 | 3/2015 | Lubomirsky |
| 2015/0079301 A1 | 3/2015 | Nemani et al. |
| 2015/0083042 A1 | 3/2015 | Kobayashi et al. |
| 2015/0118857 A1 | 4/2015 | Liu et al. |
| 2015/0118858 A1 | 4/2015 | Takaba |
| 2015/0123541 A1 | 5/2015 | Baek et al. |
| 2015/0126039 A1 | 5/2015 | Korolik et al. |
| 2015/0126040 A1 | 5/2015 | Korolik et al. |
| 2015/0126045 A1 | 5/2015 | Chatterjee et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132968 A1 | 5/2015 | Ren et al. |
| 2015/0140833 A1 | 5/2015 | Thadani et al. |
| 2015/0155189 A1 | 6/2015 | Cho et al. |
| 2015/0170920 A1 | 6/2015 | Purayath et al. |
| 2015/0179464 A1 | 6/2015 | Wang et al. |
| 2015/0206764 A1 | 7/2015 | Wang et al. |
| 2015/0214067 A1 | 7/2015 | Zhang et al. |
| 2015/0214092 A1 | 7/2015 | Purayath et al. |
| 2015/0235863 A1 | 8/2015 | Chen et al. |
| 2015/0235865 A1 | 8/2015 | Wang et al. |
| 2015/0241362 A1 | 8/2015 | Kobayashi et al. |
| 2015/0249018 A1 | 9/2015 | Park et al. |
| 2015/0270105 A1 | 9/2015 | Kobayashi et al. |
| 2015/0270106 A1 | 9/2015 | Kobayashi et al. |
| 2015/0270140 A1 | 9/2015 | Gupta et al. |
| 2015/0270366 A1 | 9/2015 | Purayath et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0299050 A1 | 10/2015 | Sun et al. |
| 2015/0311043 A1 | 10/2015 | Sun et al. |
| 2015/0311089 A1 | 10/2015 | Kim et al. |
| 2015/0318186 A1 | 11/2015 | Zhang et al. |
| 2015/0325411 A1 | 11/2015 | Godet et al. |
| 2015/0329970 A1 | 11/2015 | Khan et al. |
| 2015/0332930 A1 | 11/2015 | Wang et al. |
| 2015/0345028 A1 | 12/2015 | Wang et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0366004 A1 | 12/2015 | Nangoy et al. |

* cited by examiner

US 9,355,922 B2

SYSTEMS AND METHODS FOR INTERNAL SURFACE CONDITIONING IN PLASMA PROCESSING EQUIPMENT

TECHNICAL FIELD

The present disclosure applies broadly to the field of plasma processing equipment. More specifically, systems and methods for internal surface conditioning of a plasma generator using optical emission spectroscopy are disclosed.

BACKGROUND

Semiconductor processing often utilizes plasma processing to etch, clean or deposit material on semiconductor wafers. Predictable and reproducible wafer processing is facilitated by plasma processing parameters that are stable and well controlled. Certain changes to equipment and/or materials involved in plasma processing can temporarily disrupt stability of plasma processing. This typically occurs when such changes affect the surface chemistry of plasma system components, as compared to the surface chemistry that results from long term use in a single process. For example, plasma chamber components may require conditioning upon first-time use, or after the chamber is vented to atmospheric air. In such cases, a plasma process may initially exhibit deliverables such as etch rate, etch selectivity or deposition rate that vary but may stabilize over time, for example as surface coatings within the process chamber come into equilibrium with the plasma process conditions. Semiconductor manufacturers value rapid stabilization of process conditions and reliable confirmation of process stability, so that a new or repaired plasma chamber can be placed into use as soon as possible.

SUMMARY

In an embodiment, a plasma source includes a first electrode, configured for transfer of one or more plasma source gases through first perforations therein; an insulator, disposed in contact with the first electrode about a periphery of the first electrode; and a second electrode, disposed with a periphery of the second electrode against the insulator such that the first and second electrodes and the insulator define a plasma generation cavity. The second electrode is configured for movement of plasma products from the plasma generation cavity therethrough toward a process chamber. A power supply provides electrical power across the first and second electrodes to ignite a plasma with the one or more plasma source gases in the plasma generation cavity to produce the plasma products. One of the first electrode, the second electrode and the insulator includes a port that provides an optical signal from the plasma.

In an embodiment, a method assesses surface conditioning of one or more internal surfaces of a plasma processing system. The method includes introducing one or more plasma source gases within a plasma generation cavity of the plasma processing system, the plasma generation cavity being bounded at least in part by the one or more internal surfaces, and applying power across electrodes of the plasma processing system to ignite a plasma with the plasma source gases within the plasma generation cavity. Optical emissions from the plasma are captured with an optical probe that is disposed adjacent the plasma generation cavity and is oriented such that the captured optical emissions are not affected by interaction of the plasma with a workpiece. One or more emission peaks of the captured optical emissions are monitored to assess the surface conditioning of the one or more internal surfaces.

In an embodiment, a plasma processing system includes a remote plasma system for ionizing first source gases, and two processing units, each of the two processing units configured to receive at least the ionized first source gases from the remote processing system, and second source gases. Each of the processing units includes a plasma generation chamber that is bounded by a first planar electrode that is configured for transfer of the ionized first source gases and the second plasma source gases into the plasma generation chamber through first perforations therein, a second planar electrode that is configured with perforations configured for transfer of plasma products from the plasma generation cavity toward a process chamber, and a ring shaped insulator that is disposed about and in contact with a periphery of the first electrode, and about and in contact with a periphery of the second electrode. Each of the processing units further includes a power supply that provides electrical power across the first and second planar electrodes to ignite a plasma with the ionized first source gases and the second plasma source gases in the plasma generation cavity, to produce the plasma products. One of the first electrode, the second electrode and the insulator includes a port that provides an optical signal from the plasma. The port is disposed and oriented such that the optical signal is not influenced by interactions of the plasma products after they transfer through the second electrode toward the process chamber.

In an embodiment, a method of conditioning internal surfaces of a plasma source includes flowing first source gases into a plasma generation cavity of the plasma source that is enclosed at least in part by the internal surfaces. Upon transmitting power into the plasma generation cavity, the first source gases ignite to form a first plasma, producing first plasma products, portions of which adhere to the internal surfaces. The method further includes flowing the first plasma products out of the plasma generation cavity toward a process chamber where a workpiece is processed by the first plasma products, flowing second source gases into the plasma generation cavity. Upon transmitting power into the plasma generation cavity, the second source gases ignite to form a second plasma, producing second plasma products that at least partially remove the portions of the first plasma products from the internal surfaces.

In an embodiment, a method of conditioning one or more internal surfaces of a plasma source after the internal surfaces are exposed to atmospheric air includes flowing at least a hydrogen-containing gas into a plasma generation cavity of the plasma source, the plasma generation cavity being enclosed at least in part by the one or more internal surfaces, transmitting power into the plasma generation cavity to generate a hydrogen-containing plasma, such that H radicals remove excess oxygen from the internal surfaces, and monitoring emission peaks of the plasma until the emission peaks are stable.

In an embodiment, a method of maintaining stability of a process attribute of a plasma processing system that etches material from wafers includes generating an etch plasma within the plasma processing system to create etch plasma products, wherein portions of the etch plasma products adhere to one or more internal surfaces of the plasma processing system, using the etch plasma products to etch the material from the one of the wafers, wherein the portions of the etch plasma products adhered to the one or more internal surfaces affect the process attribute, and generating a conditioning plasma within the plasma processing system to create conditioning plasma products, wherein the conditioning plasma products remove at least some of the etch plasma products adhered to the one or more internal surfaces.

BRIEF DESCRIPTION OF THE DRAWINGS

The present disclosure may be understood by reference to the following detailed description taken in conjunction with the drawings briefly described below, wherein like reference numerals are used throughout the several drawings to refer to similar components. It is noted that, for purposes of illustrative clarity, certain elements in the drawings may not be drawn to scale. In instances where multiple instances of an item are shown, only some of the instances may be labeled, for clarity of illustration.

DETAILED DESCRIPTION

Figure 1:
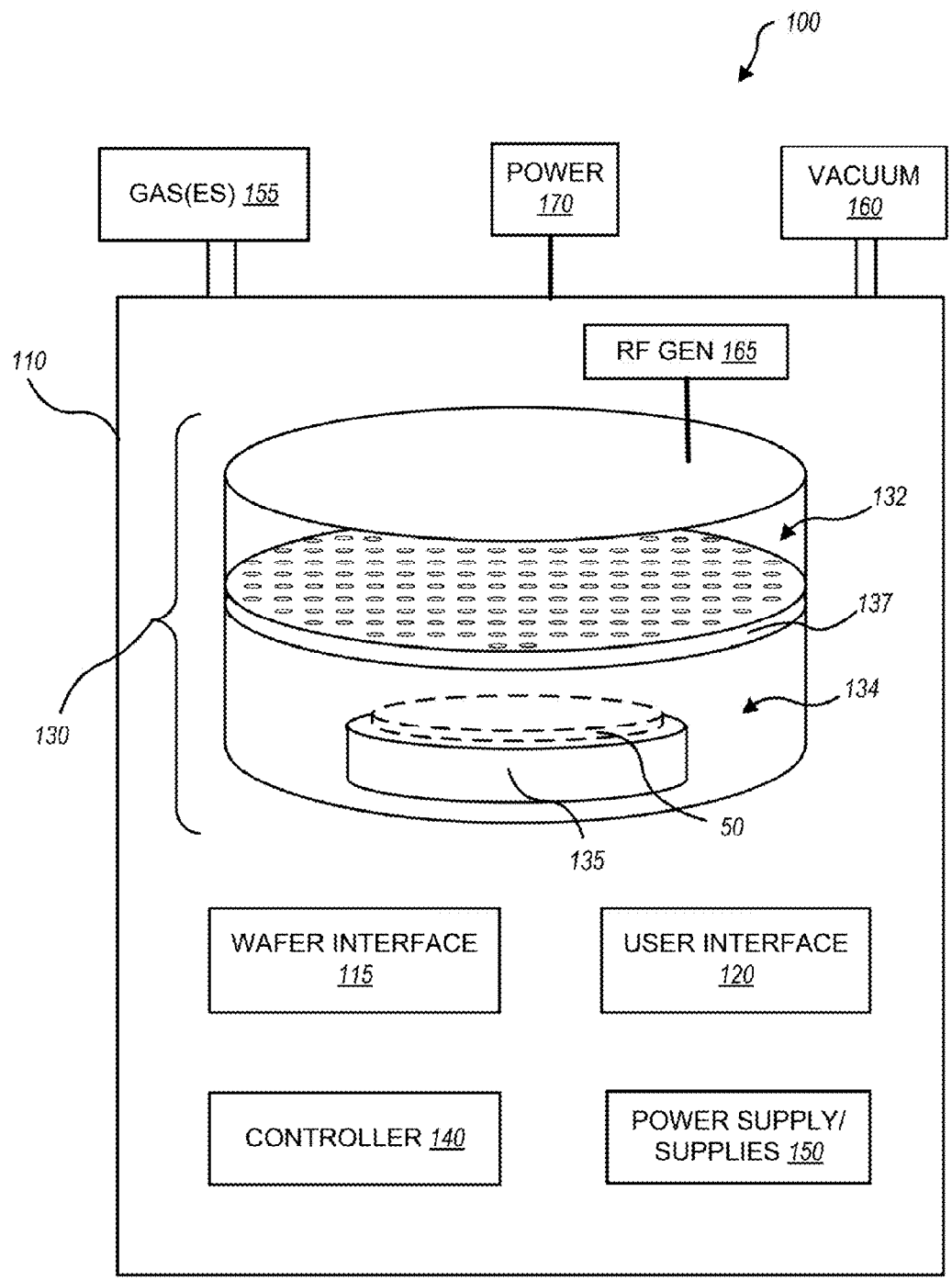
FIG. 1 schematically illustrates major elements of a plasma processing system, according to an embodiment.

FIG. 1 schematically illustrates major elements of a plasma processing system 100, according to an embodiment. System 100 is depicted as a single wafer, semiconductor wafer plasma processing system, but it will be apparent to one skilled in the art that the techniques and principles herein are applicable to plasma generation systems of any type (e.g., systems that do not necessarily process wafers or semiconductors). Processing system 100 includes a housing 110 for a wafer interface 115, a user interface 120, a plasma processing unit 130, a controller 140 and one or more power supplies 150. Processing system 100 is supported by various utilities that may include gas(es) 155, external power 170, vacuum 160 and optionally others. Internal plumbing and electrical connections within processing system 100 are not shown, for clarity of illustration.

Processing system 100 is shown as a so-called indirect, or remote, plasma processing system that generates a plasma in a first location and directs the plasma and/or plasma products (e.g., ions, molecular fragments, energized species and the like) to a second location where processing occurs. Thus, in FIG. 1, plasma processing unit 130 includes a remote plasma source 132 that supplies plasma and/or plasma products for a process chamber 134. Process chamber 134 includes one or more wafer pedestals 135, upon which wafer interface 115 places a workpiece 50 (e.g., a semiconductor wafer, but could be a different type of workpiece) for processing. In operation, gas(es) 155 are introduced into plasma source 132 and a radio frequency generator (RF Gen) 165 supplies power to ignite a plasma within plasma source 132. Plasma and/or plasma products pass from plasma source 132 through a diffuser plate 137 to process chamber 134, where workpiece 50 is processed.

Although an indirect plasma processing system is illustrated in FIG. 1 and elsewhere in this disclosure, it should be clear to one skilled in the art that the techniques, apparatus and methods disclosed herein are equally applicable to direct plasma processing systems—e.g., where a plasma is ignited at the location of the workpiece(s). Similarly, in embodiments, the components of processing system 100 may be reorganized, redistributed and/or duplicated, for example: (1) to provide a single processing system with multiple process chambers; (2) to provide multiple remote plasma sources for a single process chamber; (3) to provide multiple workpiece fixtures (e.g., wafer pedestals 135) within a single process chamber; (4) to utilize a single remote plasma source to supply plasma products to multiple process chambers; and/or (5) to provide plasma and gas sources in serial/parallel combinations such that various source gases may be ionized zero, one, two or more times, and mixed with other source gases before or after they enter a process chamber, and the like.

Plasma-Only Monitoring with OES

Figure 2:
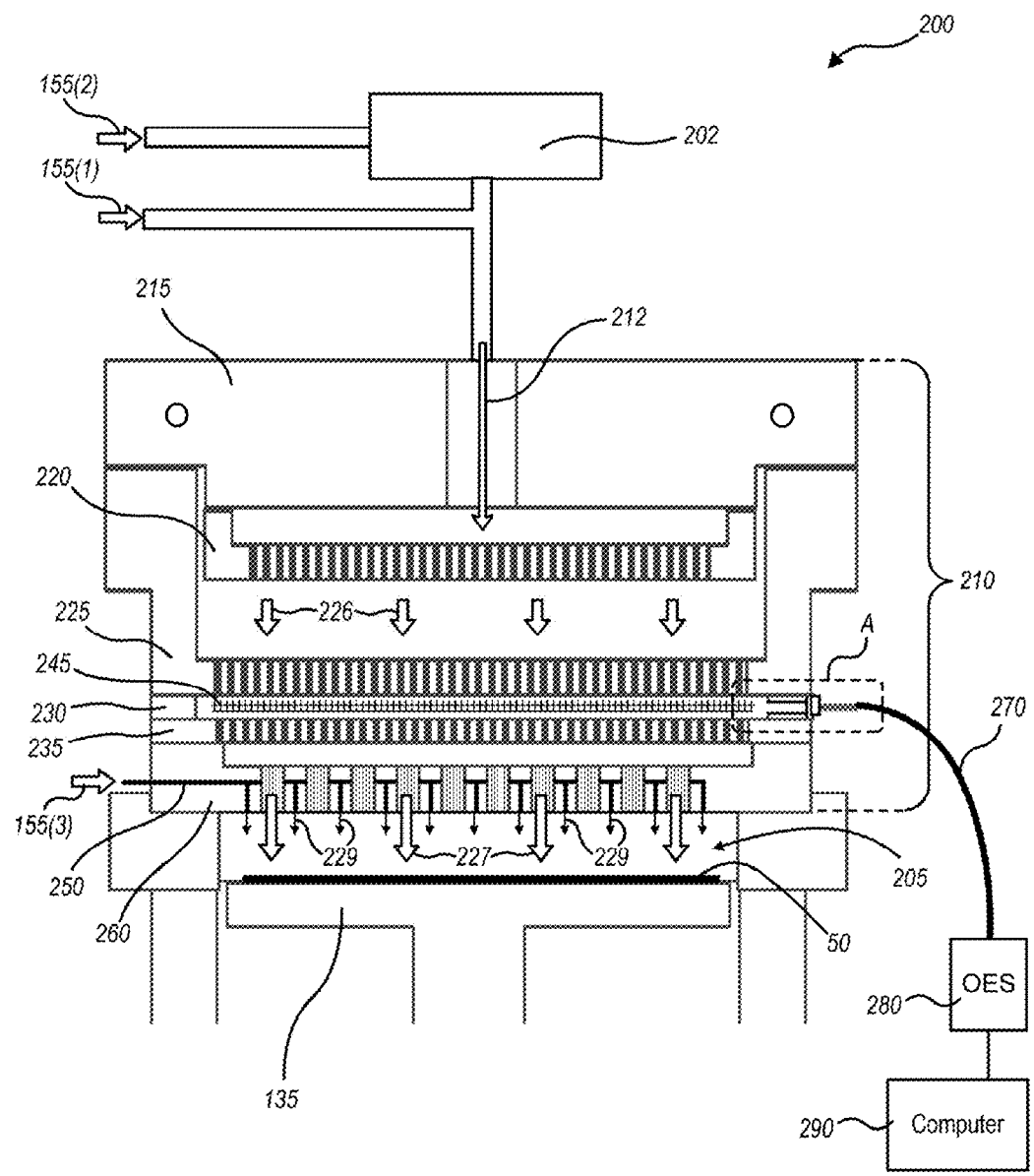
FIG. 2 schematically illustrates major elements of a plasma processing system, in a cross-sectional view, according to an embodiment.

FIG. 2 schematically illustrates major elements of a plasma processing system 200, in a cross-sectional view, according to an embodiment. Plasma processing system 200 is an example of plasma processing unit 130, FIG. 1. Plasma processing system 200 includes a process chamber 205 and a plasma source 210. As shown in FIG. 2, plasma source 210 introduces gases 155(1) directly, and/or gases 155(2) that are ionized by an upstream remote plasma source 202, as plasma source gases 212, through an RF electrode 215. RF electrode 215 includes (e.g., is electrically tied to) a first gas diffuser 220 and a faceplate 225 that serve to redirect flow of the source gases so that gas flow is uniform across plasma source 210, as indicated by arrows 231. After flowing through face plate 225, an insulator 230 electrically insulates RF electrode 215 from a diffuser 235 that is held at electrical ground (e.g., diffuser 235 serves as a second electrode counterfacing face plate 225 of RF electrode 215). Surfaces of RF electrode 215, diffuser 235 and insulator 230 define a plasma generation cavity (see plasma generation cavity 240, FIG. 3) where a plasma 245 is created when the source gases are present and RF energy is provided through RF electrode 215. RF electrode 215 and diffuser 235 may be formed of any conductor, and in embodiments are formed of aluminum (or an aluminum alloy, such as the known "6061" alloy type). Surfaces of face plate 225 and diffuser 235 that face the plasma cavity or are otherwise exposed to reactive gases may be coated with yttria ($Y_2O_3$) or alumina ($Al_2O_3$) for resistance to the reactive gases and plasma products generated in the plasma cavity. Insulator 230 may be any insulator, and in embodiments is formed of ceramic. A region denoted as A in FIG. 2 is shown in greater detail in FIG. 3. Emissions from plasma 245 enter a fiber optic 270 and are analyzed in an optical emission spectrometer ("OES") 280, as discussed further below.

Plasma products generated in plasma 245 pass through diffuser 235 that again helps to promote the uniform distribution of plasma products, and may assist in electron temperature control. Upon passing through diffuser 235, the plasma products pass through a further diffuser 260 that promotes uniformity as indicated by small arrows 227, and enter process chamber 205 where they interact with workpiece 50, such as a semiconductor wafer, atop wafer pedestal 135. Diffuser 260 includes further gas channels 250 that may be used to introduce one or more further gases 155(3) to the plasma products as they enter process chamber 205, as indicated by very small arrows 229.

Embodiments herein may be rearranged and may form a variety of shapes. For example, RF electrode 215 and diffuser 235 are substantially radially symmetric in the embodiment shown in FIG. 2, and insulator 230 is a ring with upper and lower planar surfaces that are disposed against peripheral areas of face plate 225 and diffuser 235, for an application that processes a circular semiconductor wafer as workpiece 50. However, such features may be of any shape that is consistent with use as a plasma source. Moreover, the exact number and placement of features for introducing and distributing gases and/or plasma products, such as diffusers, face plates and the like, may also vary. Also, in a similar manner to diffuser 260 including gas channels 250 to add gas 155(3) to plasma products from plasma 245 as they enter process chamber 205, other components of plasma processing system 200 may be configured to add or mix gases 155 with other gases and/or plasma products as they make their way through the system to process chamber 205.

Figure 3:
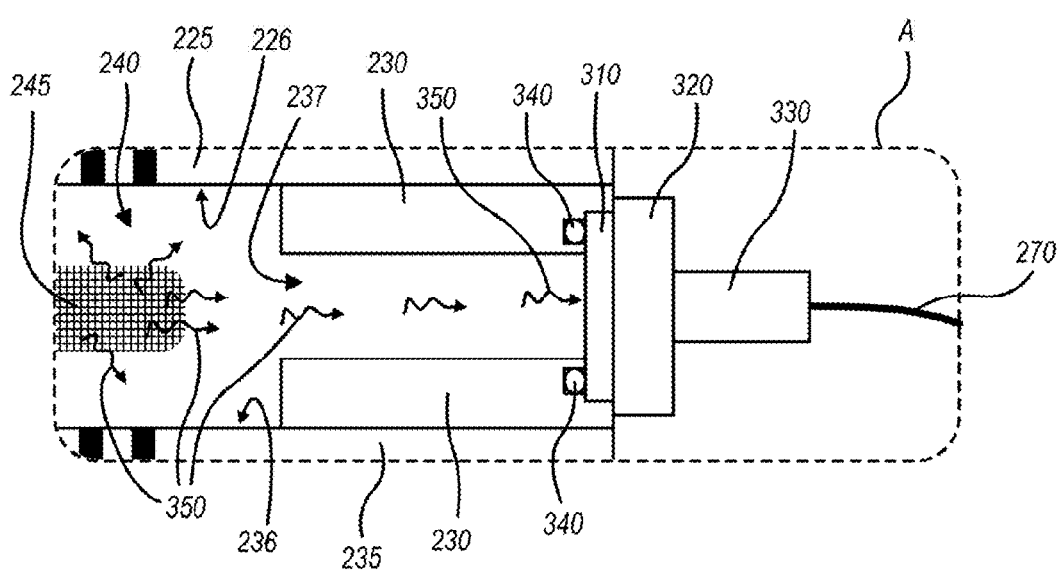
FIG. 3 schematically illustrates details of region A shown in FIG. 2.

FIG. 3 schematically illustrates details of region A shown in FIG. 2. Face plate 225, insulator 230 and diffuser 235 seal to one another such that a plasma generation cavity 240 that is bounded by face plate 225, insulator 230 and diffuser 235 can be evacuated. A facing surface 226 of face plate 225, and/or a facing surface 236 of diffuser 235 may be coated with yttria ($Y_2O_3$) or alumina ($Al_2O_3$) for resistance to the gases and/or plasmas to be used.

When plasma source gases are introduced and electrical power is provided across face plate 225 and diffuser 235, a plasma 245 can form therein. Insulator 230 forms a radial aperture 237; an optical window 310 seals to insulator 230 over aperture 237. Optical window 310 is formed of sapphire, however it is appreciated that other materials for optical window 310 may be selected based on resistance to plasma source gases and/or plasma products of plasma 245, or transmissivity to optical emissions, as discussed below. In the embodiment shown in FIG. 3, an o-ring 340 seats in recesses 345 to facilitate sealing optical window 310 to insulator 230; however, other sealing geometries and methods may be utilized. In embodiments, plasma generation cavity 240 is evacuated such that atmospheric pressure (external to plasma generation cavity 240) assists in sealing components such as optical window 310 to insulator 230.

Fiber optic 270 is positioned such that when plasma 245 exists in plasma generation cavity 240, optical emissions 350 originate in plasma 245, propagate through radial aperture 237 and optical window 310, and into fiber optic 270 to generate an optical signal therein. Fiber optic 270 transmits optical emissions 350 to OES 280, FIG. 2. In embodiments, fiber optic 270 is a 400 μm core optical fiber; however, other core sizes and various fiber materials may be selected for transmissivity of optical emissions 350 and to manage signal strength within fiber optic 270. For example, plasmas 245 that generate low levels of optical emissions 350 may be monitored utilizing a relatively wide core (e.g., 400 μm) fiber optic 270, while plasmas that generate higher levels of optical emissions 350 may be monitored utilizing relatively narrower cores (e.g., 110 μm, 100 μm, 62.5 μm, 50 μm, 9 μm or other core sizes) in order to limit the optical signal reaching OES 280. One or more filters may be utilized at OES 280 to absorb stray light and/or emissions that are not within a spectral band of interest.

OES 280 analyzes the optical signal received from fiber optic 270 to identify emission peaks within the signal, including identifying specific emission peaks as corresponding to energy transitions of specific elements. In some embodiments, spectra and/or information characterizing emission peaks therein may be viewed and/or manipulated on OES 280. In some of these and in other embodiments, emission peak information may be transferred to a computer 290 for analysis, manipulation, storage and/or display.

In embodiments, a fiber optic connector 330 terminates fiber optic 270, and a block 320 positions fiber optic connector 330 with respect to optical window 310, as shown in FIG. 3. However, this arrangement is by way of example only; other embodiments may provide a custom termination of fiber optic 270 that does not involve a connector 330, and various arrangements for positioning fiber optic 270 and/or connector 330 with respect to window 310 may be implemented in place of block 320. When utilized, block 320 may extend in and out of the cross-sectional plane shown in FIG. 3 to form attachment regions, and may fasten to insulator 230 using fasteners such as screws in such regions. Block 320 and/or screws that attach block 320 to insulator 230 are advantageously fabricated of insulative materials such as plastic or ceramic, to mitigate any possibility of electrical arcing to or from face plate 225 and diffuser 235, and/or other structures.

It is appreciated that aperture 237 and optical window 310, at least, function as a port for providing an optical signal from plasma 245 that can be utilized to monitor aspects of plasma source 210. It is also appreciated that such port may be provided at a variety of locations within a plasma source. For example, generally speaking, a capacitively coupled plasma source will include at least two electrodes separated by an insulator; a port such as described above could be disposed with any of the electrodes or the insulator. Similarly, an inductively coupled plasma source (or any other type of plasma source) could include a port disposed with any vessel in which the plasma is initially generated. Materials and/or locations of such ports should be selected so as not to disrupt electrical or magnetic circuits that are important to the plasma source (e.g., to mitigate arcing and/or disturbance of magnetic field distributions, for inductively coupled plasma sources).

Returning to FIG. 2, optical monitoring of plasma at the place where it is generated in a remote plasma source provides unique benefits. Because plasma 245 is monitored upstream of its interactions with a workpiece 50 (e.g., a wafer), the monitoring provides characterization of the plasma source alone, which may be contrasted or correlated with effects produced by interaction with the workpiece. That is, the geometry of insulator 230 and radial aperture 237 will tend to provide fiber optic 270 with an effective "view" that is limited to optical emissions resulting from plasma 245 and interactions of those emissions with adjacent surfaces, rather than emissions resulting from downstream interactions and/or direct views of surfaces within a process chamber. Monitoring of a plasma at a location where it has not yet had an opportunity to interact with a workpiece is called "upstream" plasma monitoring herein.

By way of contrast, optical monitoring of workpieces themselves, and/or plasma interaction with such workpieces, may be used to monitor certain plasma effects on the workpiece, but are susceptible to influence by the workpiece. Workpiece-affected plasma characteristics, including optical emissions captured with optical probes, are sometimes utilized to determine a plasma processing endpoint, that is, to identify a time at which processing is essentially complete such that some aspect of the plasma process can be turned off. For example, interaction with a workpiece can affect a plasma by releasing reaction products from the workpiece, and/or the workpiece can deplete reactive species from the plasma. When reaction products from the workpiece are no longer detected, it may signify that a layer to be etched has "cleared" such that etch gases and/or RF energy can be turned off. However, such optical probes are situated where the optical emissions that are captured are affected by the workpiece.

Both workpiece-affected and upstream plasma monitoring can be useful tools in determining whether variations in processed workpieces are due to variations in a plasma as generated, or due to variations present in the workpieces before they interact with the plasma. In certain embodiments herein, stable process results correlate strongly with upstream plasma monitoring results. Specifically, process results have been found to correlate with certain emission peaks measured with the apparatus described in connection with FIGS. 2 and 3. When strong correlations between upstream monitoring of plasma emission peaks and process results can be identified, it becomes possible, in embodiments, to run conditioning process cycles without exposing valuable workpieces to risk until those emission peaks are observed to be stable. Once the emission peaks are stable, workpieces can be processed in confidence that the process results will be as expected.

Stability in emission peaks obtained from upstream monitoring can indicate equilibrium in reactions between the generated plasma and adjacent surfaces. For example, certain surfaces of electrodes, diffusers and the like may interact with a plasma to slowly give off, or absorb, certain elements that are important to process results, such that the resulting plasma process will not be stable until the surfaces are in equilibrium with the plasma. In embodiments, electrodes, diffusers and the like may be coated with refractory materials such as yttria ($Y_2O_3$) or alumina ($Al_2O_3$) for resistance to the gases and/or plasmas to be used. These materials can interact with plasma products such as free hydrogen, such that plasmas generated around such surfaces may not be stable until the surfaces are either saturated or substantially depleted of hydrogen. In either case, emission peaks generated through upstream plasma monitoring can be useful for assessing plasma stability.

Accurately identifying when plasma equipment is running a stable process is valuable in the semiconductor industry. Semiconductor processing is characterized both by unusable equipment having high cost and workpieces having high value that is at risk if processing is not optimal. For example, a single plasma processing system may represent hundreds of thousands, or a few million dollars of capital investment, with output of a multimillion dollar wafer fabrication area being dependent on only a few of such systems. Yet, a single semiconductor wafer may accrue hundreds or thousands of dollars of invested processing costs, and a piece of plasma equipment might process tens of such wafers per hour. Thus the financial costs of equipment downtime, or of utilizing equipment that is not operating correctly, are both quite high.

Figure 4:
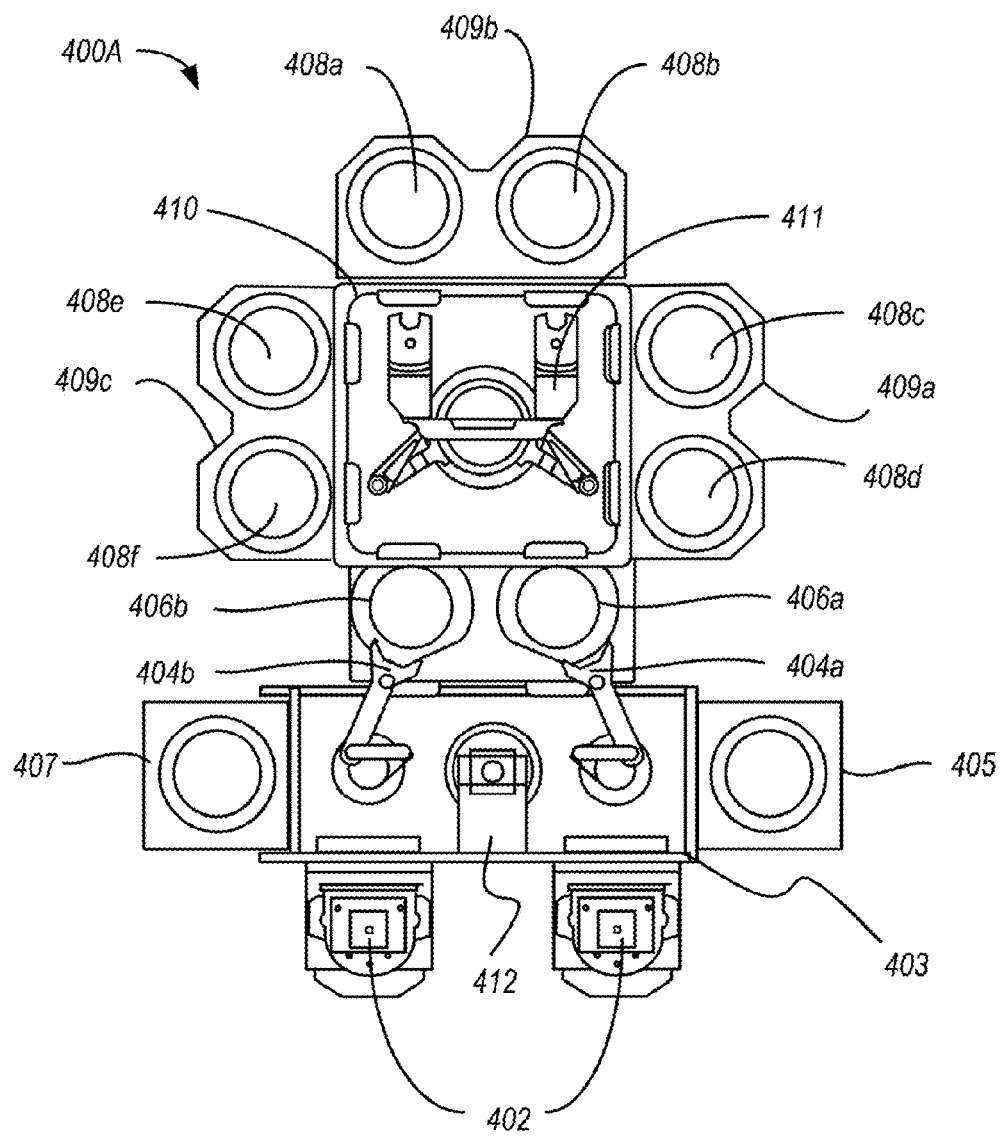
FIG. 4 schematically illustrates a top plan view of an exemplary plasma processing system configured to perform various types of processing operations, according to an embodiment.

FIG. 4 schematically illustrates a top plan view of an exemplary plasma processing system 400A configured to perform various types of processing operations. In FIG. 4, a pair of front opening unified pods ("FOUPs") or holding chambers 402 supply workpieces (e.g., semiconductor wafers) of a variety of sizes that are received by robotic arms 404 and placed into low pressure loading chambers 406 before being placed into one of the workpiece processing chambers 408a-f, positioned on tandem trays 409a-c. In alternative arrangements, the system 400A may have additional FOUPs, and may for example have 3, 4, 5, 6, etc. or more FOUPs. The process chambers may include any of the chambers as described elsewhere in this disclosure. Robotic arms 411 may be used to transport the workpieces from the loading chambers 406 to the workpiece processing chambers 408a-f and back through a transfer chamber 410. Two loading chambers 406 are illustrated, but the system may include a plurality of loading chambers that are each configured to receive workpieces into a vacuum environment for processing. Process chambers 408 and transfer chamber 410 may be maintained in an inert environment, such as with nitrogen purging, which may be continuously flowed through each of the chambers to maintain the inert atmosphere. The loading chamber 406 may similarly be configured to be purged with nitrogen after receiving a workpiece in order to provide the workpiece to the process sections in a similar environment.

Each workpiece processing chamber 408a-f, can be outfitted to perform one or more workpiece processing operations including dry etch processes, cyclical layer deposition (CLD), atomic layer deposition (ALD), chemical vapor deposition (CVD), physical vapor deposition (PVD), etch, preclean, degas, orientation, and other workpiece processes. In a disclosed embodiment, for example, the system may include at least two pairs of tandem processing chambers. A first of the at least two pairs of tandem processing chambers may be configured to perform a silicon oxide etching operation, and the second of the at least two pairs of tandem processing chambers may be configured to perform a silicon or silicon nitride etching operation. A given pair of processing chambers 408 may both be configured for a specific process step, and monitored using methods described herein to ensure that the processing provided by each of the pair of chambers matches closely to the other. When configured in pairs, each processing chamber 408 may be coupled independently with support equipment such as gas supplies, RF generators, remote plasma generators and the like, but in embodiments, adjacent processing chambers 408 share connections with certain such support equipment.

The workpiece processing chambers 408a-f may include one or more system components for depositing, annealing, curing and/or etching a film on the workpiece. In one configuration, two pairs of the processing chambers, e.g., 408*c*-*d* and 408*e*-*f*, may be used to perform a first etching operation on the workpiece, and the third pair of processing chambers, e.g., 408*a*-*b*, may be used to perform a second etching operation on the workpiece. In another configuration, all three pairs of chambers, e.g., 408*a*-*f*, may be configured to etch a dielectric film on the workpiece. In still another configuration, a first pair of the processing chambers, e.g., 408*a*-*b*, may perform a deposition operation, such as depositing a flowable film, a native oxide, or additional materials. A second pair of the processing chambers, e.g., 408*c*-*d*, may perform a first etching operation, and the third pair of the processing chambers, e.g., 408*e*-*f*, may perform a second etching operation. Any one or more of the processes described may be alternatively carried out in chambers separated from the fabrication system shown in different embodiments. It will be appreciated that additional configurations of deposition, etching, annealing, and curing chambers for films are contemplated by system 400A.

The processing chambers herein may perform any number of processes, such as a PVD, a CVD (e.g., dielectric CVD, MCVD, MOCVD, EPI), an ALD, a decoupled plasma nitridation (DPN), a rapid thermal processing (RTP), or a dry-etch process to form various device features on a surface of a workpiece. The various device features may include, but are not limited to, the formation and/or etching of interlayer dielectric layers, gate dielectric layers, polycrystalline silicon ("polysilicon") layers or gates, forming vias and trenches, planarization steps, and depositing contact or via level interconnects. In one embodiment, certain positions may be occupied by service chambers that are adapted for degassing, orientation, cool down, analysis and the like. For example, one chamber may include a metrology chamber that is adapted to perform a preparation/analysis step and/or a post-processing/analysis step to analyze a property of the workpiece before or after performing a processing step in a processing sequence. In general, the properties of the workpiece that can be measured in the metrology chamber may include, but are not limited to, a measurement of intrinsic or extrinsic stress in one or more layers deposited on a surface of the workpiece, film composition of one or more deposited layers, a number of particles on the surface of the workpiece, and/or a thickness of one or more layers found on the surface of the workpiece. Data collected from the metrology chamber may then be used by a system controller to adjust one or more process variables in one or more of the processing steps to produce favorable process results on subsequently processed workpieces.

System 400A may include additional chambers 405, 407 on opposite sides of an interface section 403. The interface section 403 may include at least two interface transfer devices, such as robot arms 404, that are configured to deliver workpieces between FOUPs 402 and the plurality of loading chambers 406. The holding chambers 402 may be coupled with the interface section 403 at a first location of the interface section, and the loading chambers may be coupled with the interface section 403 at a second location of the interface section 403 that is opposite the plurality of holding chambers 402. The additional chambers may be accessed by interface robot arms 404, and may be configured for transferring workpieces through interface section 403. For example, chamber 405 may provide, for example, wet etching capabilities and may be accessed by interface robot arm 404*a* through the side of interface section 403. The wet station may be coupled with interface section 403 at a third location of interface section 403 between the first location and second location of the interface section. In disclosed embodiments the third location may be adjacent to either of the first and second locations of interface section 403. Additionally, chamber 407 may provide, for example, additional storage and may be accessed by interface robot arm 404*b* through the opposite side of interface section 403 from chamber 405. Chamber 407 may be coupled with interface section 403 at a fourth location of the interface section opposite the third location. Interface section 403 may include additional structures for allowing the transfer of workpieces between the robot arms 404, including transfer section 412 positioned between the robot arms 404. Transfer section 412 may be configured to hold one or more workpieces, and may be configured to hold 2, 5, 10, 15, 20, 25, 50, 100 etc. or more workpieces at any given time for delivery for processing. A transfer section 412 may include additional capabilities including cooling of the workpieces below atmospheric conditions as well as atmospheric cleaning of the wafers, for example. The system 400A may additionally include gas delivery systems and system controllers (not shown) for providing precursors and instructions for performing a variety of processing operations.

Figure 5:
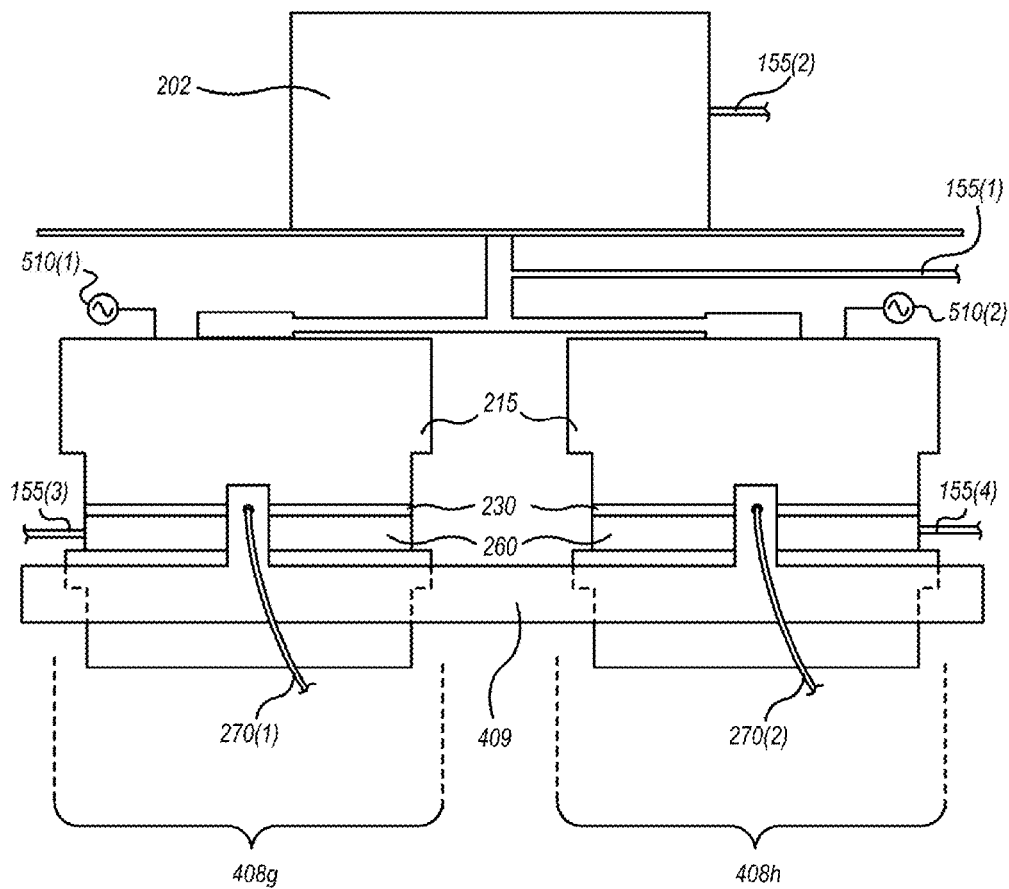
FIG. 5 schematically illustrates a pair of processing chambers, disposed as a tandem pair of processing chambers with a tandem tray, according to an embodiment.

FIG. 5 is a schematic side view illustrating a pair of processing chambers 408*g* and 408*h*, disposed as a tandem pair of processing chambers with a tandem tray 409. Each processing chamber 408*g*, 408*h* is shown in simplified form relative to the features shown in FIGS. 2 and 3, but should be understood to include the same components. Components that are the same for both processing chambers 408*g*, 408*h* include RF electrode 215, insulator 230 and diffuser 260. In the embodiment shown in FIG. 5, a remote plasma source (RPS) 202 is a shared resource for both processing chambers 408*g*, 408*h*. RPS 202 receives input process gas(es) 155(2); further input process gas(es) 155(1) may be mixed with plasma products from RPS 202 and provided to processing chambers 408*g* and 408*h*, as shown. Processing chambers 408*g* and 408*h* may receive further process gas(es) 155(3) and 155(4), and may be respectively energized by RF power supplies 510(1) and 510(2). Gases 155(3) and 155(4), and RF power supplies 510(1) and 510(2) are independently controllable for processing chambers 408*g* and 408*h*. That is, it is possible to provide different gas(es) and flow rates through the gas connections, and/or operate one of RF power supplies 510(1) and 510(2) at a time, or operate power supplies 510(1) and 510(2) at different power levels. The ability to control gases 155(3) and 155(4) and RF power supplies 510(1) and 510(2) independently is an important feature for processing and chamber conditioning purposes, as discussed further below.

Figure 6:
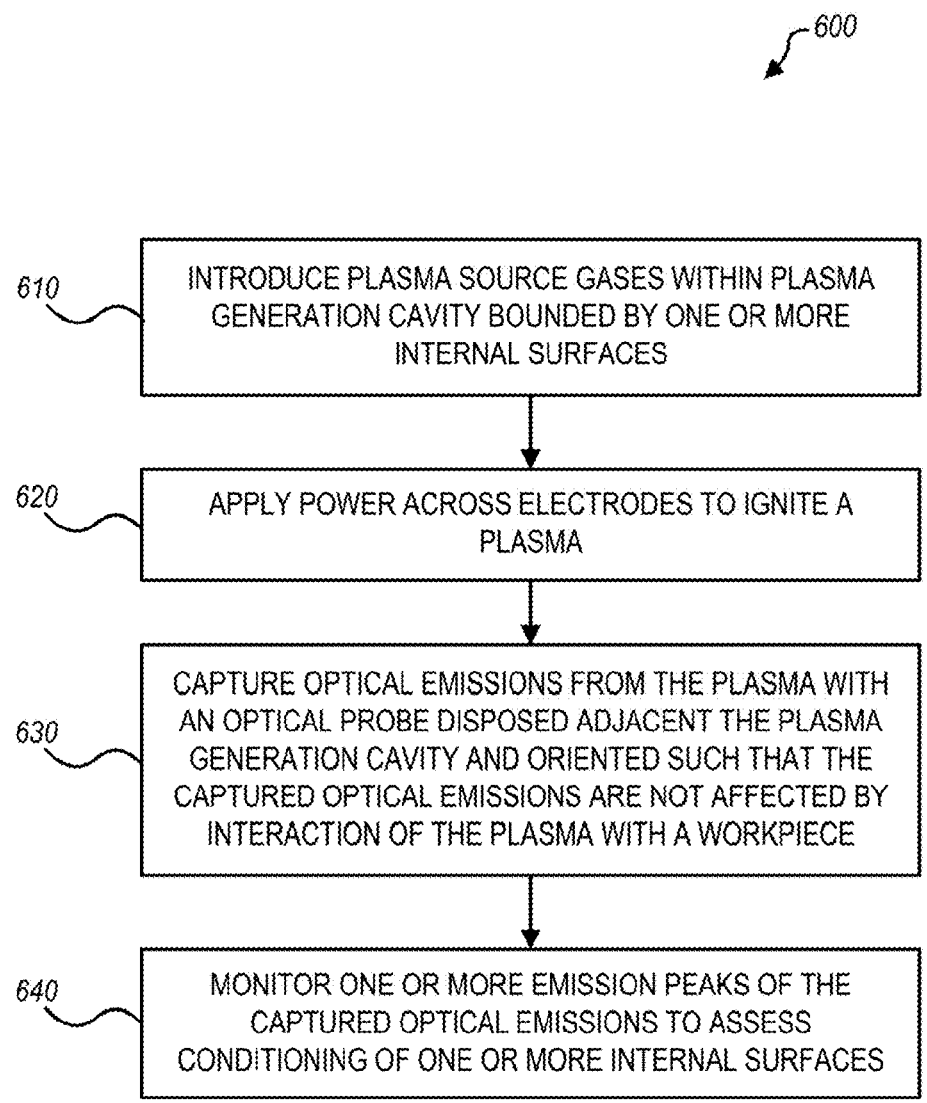
FIG. 6 is a flowchart illustrating a method for assessing surface conditioning of one or more internal surfaces of a plasma processing system, according to an embodiment.

FIG. 6 is a flowchart illustrating a method 600 for assessing surface conditioning of one or more internal surfaces of a plasma processing system. Method 600 begins with introducing one or more plasma source gases within a plasma generation cavity of the plasma system (610). The cavity is bounded at least in part by the internal surfaces. For example, surface conditioning of surfaces of face plate 225 (part of RF electrode 215) and diffuser 235 of plasma processing system 200, FIG. 2, can be assessed. In this case, as shown in FIGS. 2 and 3, plasma generation cavity 240 is bounded at least in part by internal surfaces 226 and 236 (labeled only in FIG. 3). Plasma source gases 212 can be introduced, as shown in FIG. 2. Method 600 proceeds to apply power across electrodes of the plasma apparatus to ignite a plasma with the plasma source gases within the plasma generation cavity (620). For example, RF power may be provided across RF electrode 215 (including face plate 225) and diffuser 235, igniting plasma 245 within plasma generation cavity 240, as shown in FIGS. 2 and 3. Method 600 further proceeds to capture optical emissions from the plasma with an optical probe that is disposed adjacent the plasma generation cavity (630). The optical probe is oriented such that the captured optical emissions are not affected by interaction of the plasma with a workpiece. An example of capturing the optical emissions is receiving optical emissions 350 through optical window 310 into fiber optic 270, FIG. 3. Method 600 further proceeds to monitor one or more emission peaks of the captured optical emissions to assess conditioning of the one or more internal surfaces (640). An example of monitoring one or more emission peaks of the captured optical emissions is optical emission spectrometer 280, FIG. 2, analyzing the optical signal captured into fiber optic 270 to identify emission peaks, and utilizing information of the emission peaks to assess conditioning of the surfaces.

In embodiments, the emission peak information may be evaluated by a human. Alternatively, OES 280 and/or computer 290 may generate stability metrics from the information. For example, a process sequence (hereinafter referred to as a "recipe," which could be an "etch recipe," a "deposition recipe," a "conditioning recipe" or other types, depending on the processing performed by the process sequence) may include a step during which OES 280 measures optical emissions and creates information about emission peaks. The information may include what peaks (e.g., spectral wavelengths or wavelength bands) are detected, and/or intensity of one or more detected emission peaks. The information may be further processed by assessing trends such as changes in emission peak intensity over recipe cycles, or by statistics such as calculating mean, median, standard deviation and the like over groups of recipe cycles.

Figure 7A:
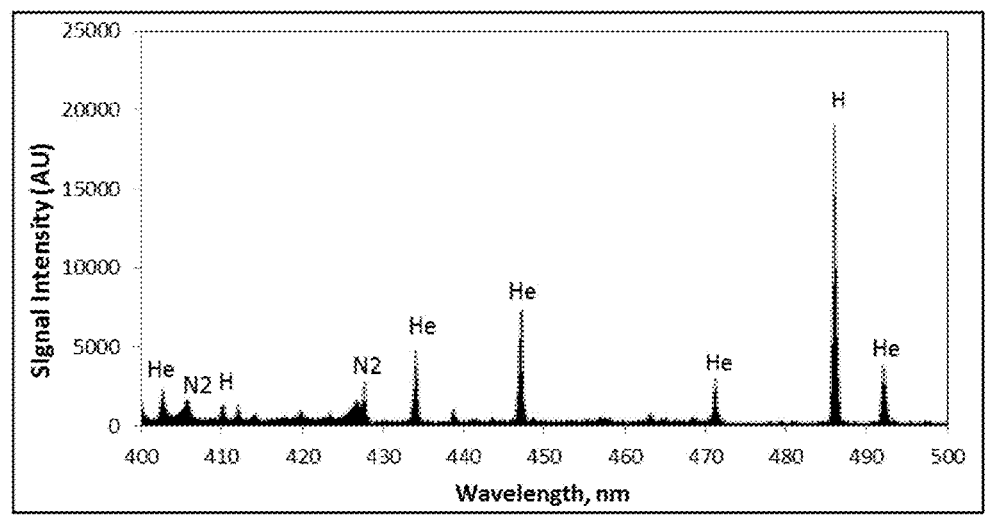
FIGS. 7A and 7B illustrate emission peak information obtained by using the method illustrated in FIG. 6, with apparatus like that shown in FIGS. 2 and 3, according to an embodiment.
Figure 7B:
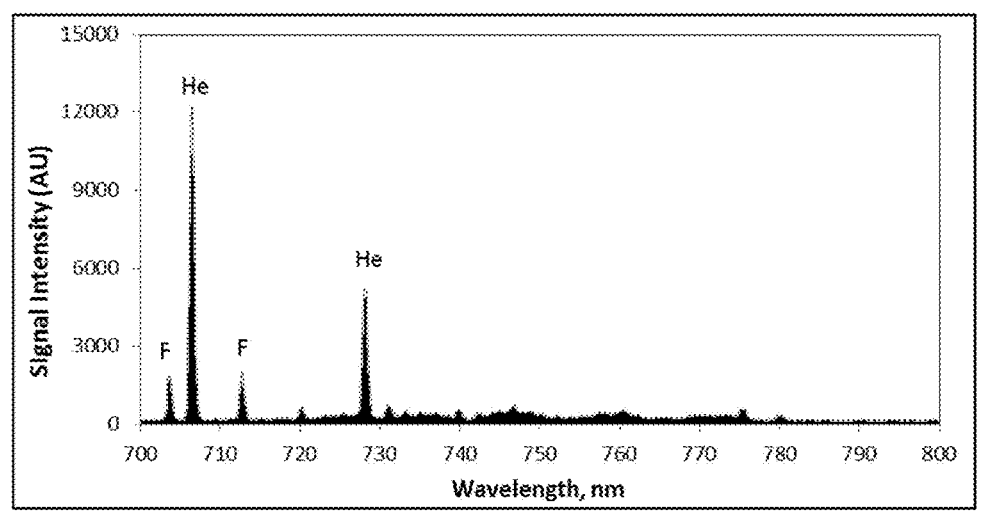

FIGS. 7A and 7B illustrate emission peak information obtained by using method 600 with apparatus like that shown in FIGS. 2 and 3, for a plasma generated for a polysilicon etch process. Optical emissions of a plasma were measured and displayed using an OES 280 that automatically identifies known emission peaks. In the examples shown in FIGS. 7A and 7B, peaks corresponding to He, $N_2$, H and F are labeled. The vertical axis of each of FIGS. 7A and 7B is in arbitrary units (AU) of signal intensity. Emission peak information such as intensities of individual peaks, ratios of peak intensities, and other statistics can be utilized to assess conditions of surfaces adjacent to the plasma that is measured.

Figure 8A:
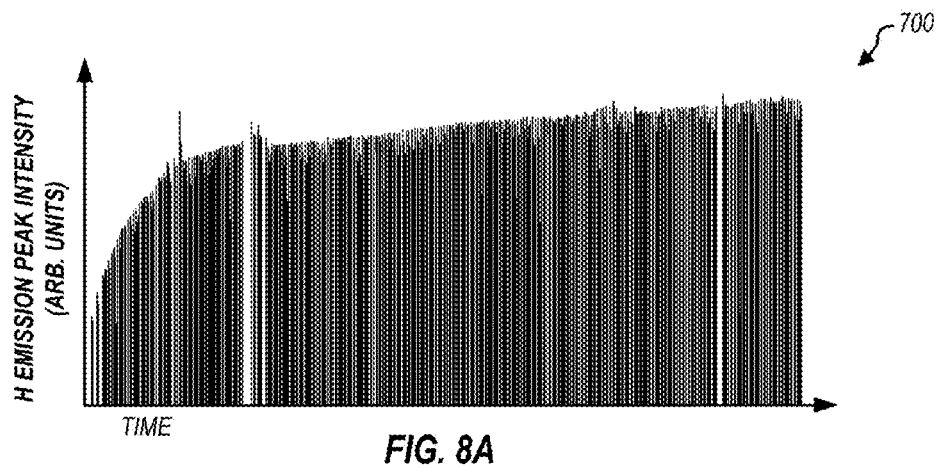
FIGS. 8A and 8B show plots of emission peak intensities measured in a plasma chamber, over time, for a hydrogen peak and for fluorine peaks, according to an embodiment.
Figure 8B:
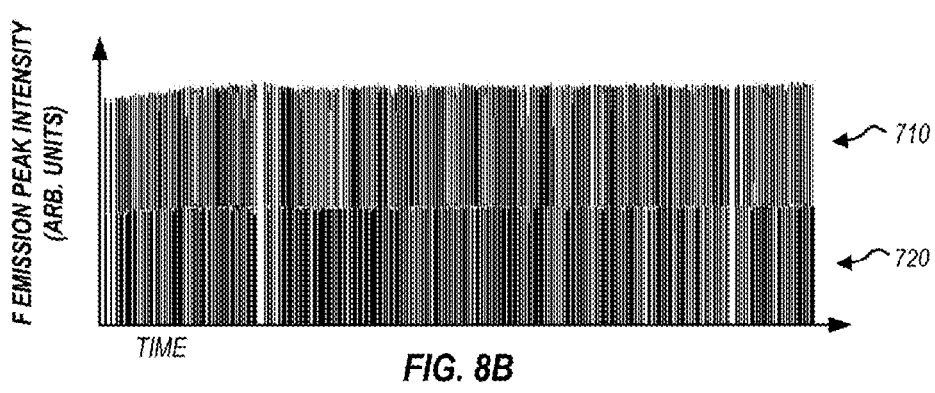
Figure 9:
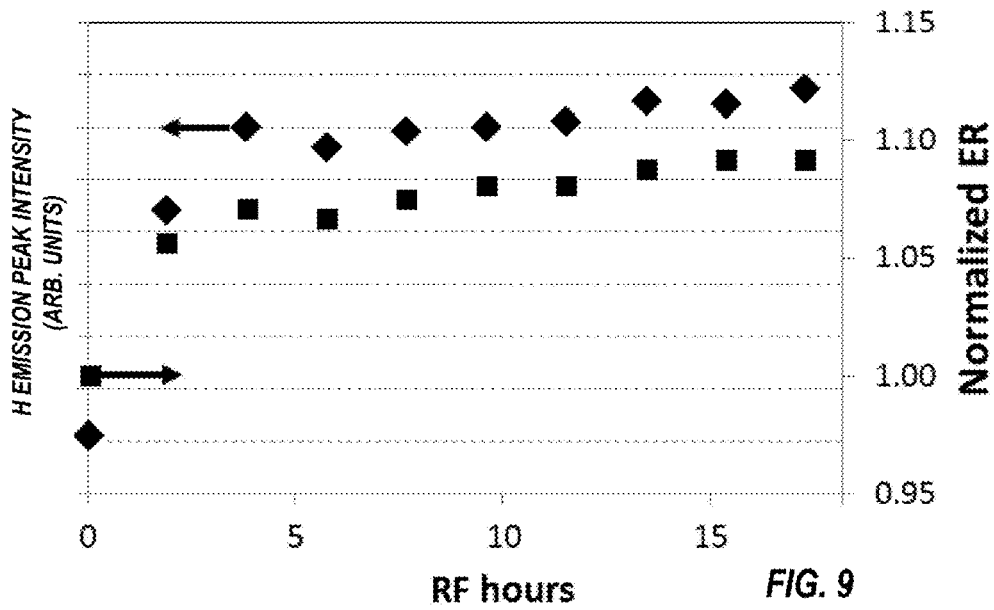
FIG. 9 is a plot of selected ones of the hydrogen emission peaks from FIG. 8A, and etch rate measurements taken at the corresponding times as the selected hydrogen emission peaks, according to an embodiment.

An example of assessing conditions of surfaces adjacent to a plasma is illustrated in FIGS. 8A, 8B and 9. FIGS. 8A and 8B show plots of emission peak intensities measured in a chamber generating a plasma for a polysilicon etch process, over time, for a hydrogen peak (FIG. 8A, data 700) and for fluorine peaks (FIG. 8B, data 710, 720). Both FIGS. 8A and 8B show data from the same plasma chamber at the same time, starting after an equipment intervention was performed, during which the chamber was open to atmospheric air for a time. Conditioning cycles were run, and etch rate of a plasma process on polysilicon was periodically measured. The time period represented in FIGS. 8A and 8B is approximately 18 hours.

In FIG. 8A, it can be seen in data 700 that the hydrogen peak intensity gradually increases over time. In FIG. 8B, it can be seen in data 710 and 720 that the fluorine peak intensity increases slightly within about the first two hours, but then remains about constant.

FIG. 9 is a plot of selected ones of the hydrogen emission peaks from FIG. 8A, and polysilicon etch rate measurements taken at times corresponding to the selected hydrogen emission peaks. The diamond shaped points in FIG. 9 are the H emission peak intensities, correlated to the left hand vertical axis; the square shaped points are the polysilicon etch rate measurements, correlated to the right hand vertical axis; time is on the horizontal axis. It can be seen that the polysilicon etch rate varies similarly, over time, as the H emission peak intensities. A trend analysis of etch rate against H emission peak intensity revealed a correlation coefficient $r^2$ of 0.97 for the relationship of etch rate to H emission peak intensity. Therefore, the H emission peak intensity strongly predicted etch rate, such that stability in the H peak can be used as an indicator of equipment stability. Reaction mechanisms underlying these phenomena, and conditioning plasma recipes to improve etch process stability are now explained.

Si Etch and Chamber Conditioning Chemistry and Recipes

A polysilicon (Si) etch process associated with the data in FIGS. 7A, 7B, 8A, 8B and 9 proceeds according to the reaction:

$$2NF_3 + H_2 + Si(s) \rightarrow 2HF + SiF_4 + N_2 \qquad \text{Reaction (1)}$$

wherein all of the species noted are in gas form except for solids marked with (s). In reaction (1), polysilicon is the solid Si and is provided as a film on workpiece 50, a semiconductor wafer; $NF_3$ and $H_2$ are provided as gases and/or plasma products (e.g., generated in plasma 245, see FIG. 2). Certain intermediate steps are omitted in reaction (1); for example the plasma products generated in plasma 245 include free H radicals.

Free H radicals in plasma 245 can adhere to yttria surfaces of face plate 225 and diffuser 235. Although the full stoichiometry of yttria is $Y_2O_3$, a yttria surface typically presents YO at an outermost part of the surface, with which an H radical can form a dangling bond:

$$H + YO \rightarrow YOH \qquad \text{Reaction (2)}$$

Figure 10A:
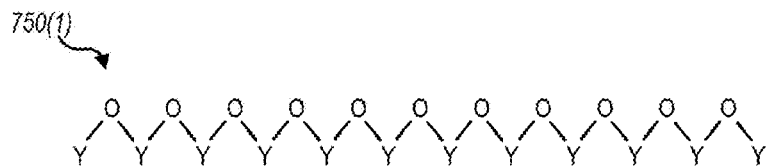
FIG. 10A illustrates a yttria surface that is devoid of hydrogen, according to an embodiment.
Figure 10B:
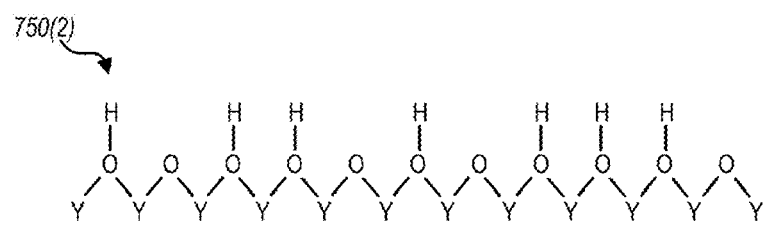
FIG. 10B illustrates the yttria surface of FIG. 10A, with a few H radicals adhered to the surface through dangling bonds, according to an embodiment.

FIG. 10A illustrates a yttria surface 750(1) that is devoid of hydrogen, while FIG. 10B illustrates the same surface with a few H radicals adhered to the surface through dangling bonds, forming surface 750(2). Because surface 750(1) reacts with a fraction of H radicals in plasma 245, the H radical concentration passing through diffuser 235 is depleted. As more and more H radicals bond to the surface to form surface 750(2), the rate of H radical depletion is reduced, causing the H radical concentration reaching workpiece 50 to increase, leading to an etch rate increase as per reaction (1).

While it may be possible in some cases to saturate a yttria surface with hydrogen to stabilize etch rate, it can be very time consuming to do so, and certain adverse process characteristics may result. An alternative is to at least remove a portion of the hydrogen and leave the surface at least substantially hydrogen free, such that the etch rate is at least predictable. Free fluorine radicals can scavenge the hydrogen, according to the reaction:

$$F + YOH(s) \rightarrow YO(s) + HF \qquad \text{Reaction (3)}$$

Figure 10C:
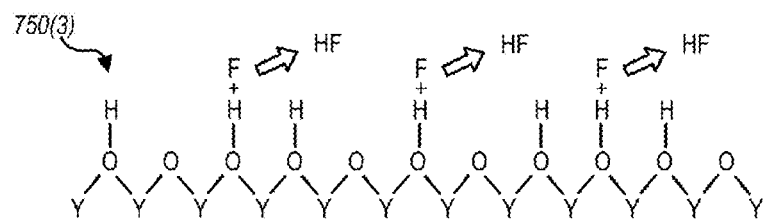
FIG. 10C illustrates the yttria surface of FIG. 10B, with F radicals reacting with some of the H radicals, according to an embodiment.

Free F radicals can be supplied to perform reaction (3) through a conditioning plasma step. In an embodiment, the conditioning plasma step generates a plasma from $NF_3$. While other F-containing gases could be used for the conditioning step, $NF_3$ may be advantageously used if it is already plumbed into the plasma processing equipment for a Si etch step. FIG. 10C illustrates a yttria surface 750(3) reacting with free F radicals to strip some of the H, as compared with yttria surface 750(2). To reestablish etch rate stability in a chamber having excess H on yttria surfaces, it is not necessary to remove all of the H. To stabilize etch rate within a reasonable amount of time, it may be sufficient to remove about as much H with a conditioning recipe, as is added in an etch step. This can be done by performing the conditioning plasma in between successive workpiece processing steps. When a polysilicon etch process and the wafers being etched are stable, a conditioning recipe can be run as a timed $NF_3$ plasma step. It may also be desirable to monitor the H emission peak during an $NF_3$ plasma to determine a suitable time to stop the plasma (e.g., based on the H emission peak falling to a particular value). The H peak could be monitored during the conditioning $NF_3$ plasma step, or the H peak could be monitored during the etch step and used to adjust one or more parameters of the subsequent conditioning plasma step, such as gas flows, pressure, RF power or time during the conditioning plasma step.

Figure 11:
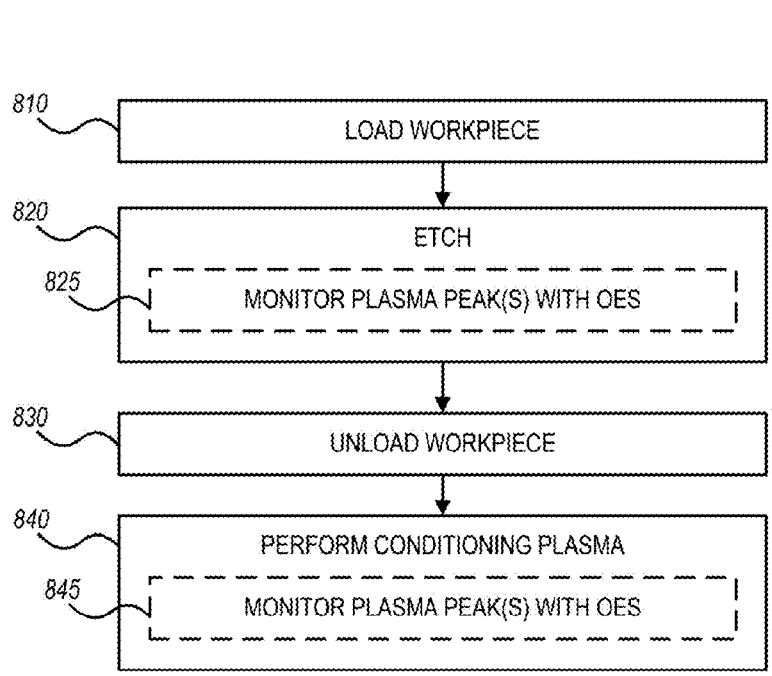
FIG. 11 is a flowchart that illustrates an etch recipe that alternates etching on a workpiece, with a conditioning step, according to an embodiment.

FIG. 11 is a flowchart that illustrates an etch recipe 800 that alternates etching on a workpiece, with a conditioning step. Etch recipe 800 is generalized in that a variety of etch and conditioning steps can be used, as now discussed.

Recipe 800 begins by loading a workpiece to be etched, in step 810. An example of step 810 is loading a semiconductor wafer with Si to be etched into plasma processing system 200, FIG. 2. Next, in step 820 the etch is performed. An example of step 820 is etching Si with $NF_3+H_2$, according to reaction (1) above. During step 820, surfaces of the plasma processing system may be degraded by plasma products and/or gases used for the etching. An example of such degradation is H radicals forming dangling bonds to yttria surfaces, according to reaction (2) above. An optional step 825 of monitoring an emission peak in the plasma using OES may be performed concurrently with step 820, utilizing the apparatus discussed above (see FIGS. 2 and 3). The emission peak information may be used as an equipment monitor to confirm that the chamber condition, and thus the etch rate, is stable from workpiece to workpiece, and/or to adjust time of the conditioning step (step 840). In an example of step 825, H emission peak information is monitored, recorded and/or used to determine when to stop later step 840. After step 820, the workpiece may be unloaded in an optional step 830; alternatively, step 830 may be omitted if the processing described in step 840 will not impact the workpiece. Omission of step 830 may lead to recipe 800 running a bit quicker than if step 830 is included, because of the time typically required to evacuate the process chamber for unloading, and to reestablish gas flows for the plasma generated in step 840.

Next, in step 840 a conditioning plasma is performed. An example of step 840 is conditioning the plasma generation chamber with an $NF_3$ plasma to remove H from the yttria surfaces, according to reaction (3) above. An optional step 845 of monitoring an emission peak in the plasma using OES may be performed concurrently with step 840. An example of optional step 845 is monitoring an H emission peak in the plasma using OES. The emission peak information can be used to adjust time of step 840, and/or as an equipment monitor to confirm that the chamber condition, and thus the etch rate, is consistent after each repetition of recipe 800.

Considering recipe 800 in the context of FIGS. 4 and 5, it is appreciated that when a pair of processing chambers 408 are dedicated to similar processes, etch step 820 and/or conditioning plasma step 840 could be adjusted specifically for each of the pair of chambers 408, and this tailoring may be based on emission peak monitoring. For example, recipe 800 could monitor an emission peak during either etch step 820 or conditioning plasma step 840, and adjust parameters such as gas flows, pressures, RF power and/or time of conditioning step 840 across the two chambers to keep performance of the two chambers tightly matched at etch step 820.

$Si_3N_4$ Etch and Chamber Conditioning Chemistry and Recipes

An exemplary silicon nitride ($Si_3N_4$, sometimes referred to herein simply as "nitride") etch process proceeds according to the reaction:

$$4NF_3 + Si_3N_4 \rightarrow 3SiF_4 + 4N_2 \quad \text{Reaction (4)}$$

In reaction (4), Si3N4 is provided as a film on workpiece 50, a semiconductor wafer; plasma products of $NF_3$ are provided to the workpiece (e.g., generated in plasma 245, see FIG. 2). Certain intermediate steps are omitted in reaction (1); for example the plasma products generated in plasma 245 include free F radicals.

Free F radicals in plasma 245 can adhere to yttria surfaces of face plate 225 and diffuser 235, forming dangling bonds:

$$F + YO \rightarrow YOF \quad \text{Reaction (5)}$$

Figure 12A:
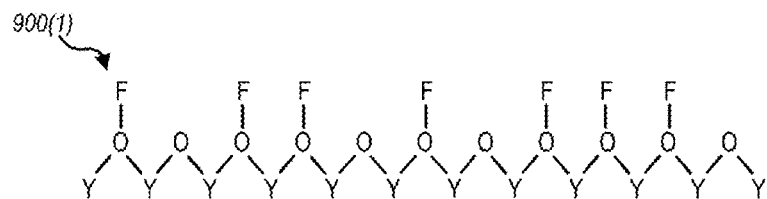
FIG. 12A illustrates a yttria surface with a few F atoms adhered to the surface through dangling bonds, according to an embodiment.

FIG. 12A illustrates a yttria surface 900(1) with a few F radicals adhered to the surface through dangling bonds. The F radicals can desorb from the yttria surface during etching, and cause degraded etch selectivity of the nitride etch with respect to silicon dioxide ($SiO_2$, sometimes referred to herein simply as "oxide"). In at least some processing scenarios, nitride etches need to be selective to nitride over oxide, that is, they should etch nitride at a much higher rate than they etch oxide. Somewhat analogously to the Si etch discussed above, the oxide etch rate will climb, and thus the selectivity will degrade, as the F on the chamber walls increases.

Another application of recipe 800 provides a way to ameliorate this issue. Free H radicals can scavenge F from the chamber walls, much like the reverse of reaction (3) above:

$$H + YOF(s) \rightarrow YO(s) + HF \quad \text{Reaction (6)}$$

Figure 12B:
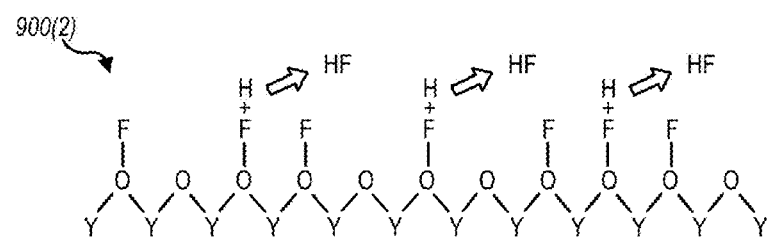
FIG. 12B illustrates a yttria surface undergoing a reaction to remove fluorine, according to an embodiment.

FIG. 12B illustrates yttria surface 900(2) undergoing reaction (6). Like the Si etch and adsorbed H discussed above, it may not be necessary to remove all of the F from yttria surface 900(2), but it may be helpful to scavenge F just down to a low enough level that poor selectivity to oxide ceases to be an issue.

Therefore, in one embodiment, recipe 800 can be run using $NF_3$ in etch step 820 to drive reaction (4), etching $Si_3N_4$, and using a hydrogen-containing gas such as $NH_3$ and/or $H_2$ in conditioning step 840, to generate free H radicals to drive reaction (6). In this case, F emission peaks could be monitored in step 845 to ensure consistency of the plasma chamber condition at the end of step 840, before the next recipe cycle when etch step 820 will be performed. It may also be possible to run conditioning step 840 longer to drive adsorbed F to extremely low levels if the next workpiece(s) to be processed would benefit from an extremely high selectivity etch. Also, in this embodiment, it may be possible to run recipe 800 without step 830, if the workpiece would not be adversely affected by hydrogen plasma products with traces of HF.

Chamber Conditioning Chemistry and Recipes—Adsorbed Oxygen from Moisture

Figure 13A:
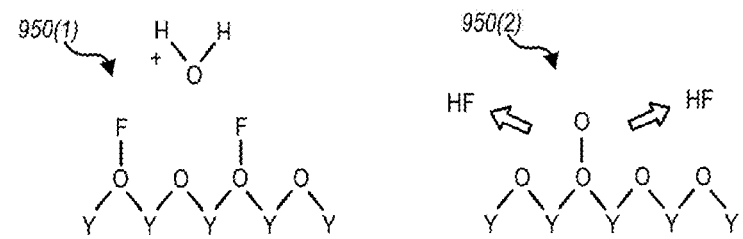
FIG. 13A illustrates a yttria surface with adsorbed fluorine, reacting with moisture to form $YO_2$ in solid form, and HF which is carried away in gas form, according to an embodiment.

When plasma equipment is newly built or exposed to atmospheric air during maintenance work, moisture can react with fluorinated yttria surfaces such that extra oxygen adheres to such surfaces. The oxygen adsorption process proceeds according to the reaction:

$$2YOF + H_2O \rightarrow YO + YO_2 + 2HF \quad \text{Reaction (7)}$$

which is illustrated in FIG. 13A, showing surface 950(1) with adsorbed fluorine, reacting to form $YO_2$ in solid form, and HF which is carried away in gas form. The extra O on the yttria surface may react with processing plasmas and/or interfere with intended reactions of such plasmas.

Like reducing adsorbed F, YO$_2$ can be treated with a hydrogen-containing gas such as NH$_3$ and/or H$_2$ to form a plasma that removes the extra oxygen, leaving the yttria in its native state. The plasma produces free H radicals as plasma products, which react according to:

  Reaction (8)

Figure 13B:
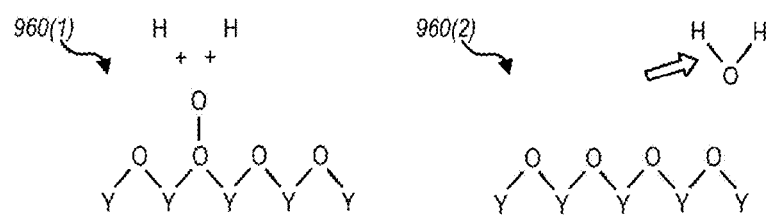
FIG. 13B illustrates the yttria surface of FIG. 13A, with an oxygen atom of $YO_2$ in solid form reacting with H radicals to form $H_2O$, which is carried away in vapor form, according to an embodiment.

FIG. 13B shows surface 960(1) with an instance of YO$_2$ in solid form. As shown in FIG. 13B, H radicals react with an oxygen atom of the YO$_2$ to form H$_2$O, which is carried away in vapor form from the resulting surface 960(2). Like the Si etch case discussed above, an H emission peak could be monitored for stability of plasma generation cavity surfaces, a constant H peak signifying a stable YO surface. Also, the H containing plasma may leave H adhered to YO surfaces, as discussed in connection with FIG. 10B above. Therefore, depending on the processing that is intended for the plasma processing equipment, the chamber could be further conditioned with plasma generated from a fluorine-containing gas (e.g., NF$_3$) to reduce hydrogen that may adhere to YO surfaces during the H radical treatment, as shown in FIG. 10C. The conditioning treatment would amount to simply running step 840 of recipe 800 (FIG. 11), optionally monitoring one or more emission peak(s) with an optical emission spectrometer (step 845) until the peaks are stable.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" or "a recipe" includes a plurality of such processes and recipes, reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A method of conditioning one or more internal surfaces of a plasma source, comprising:
    flowing one or more first source gases into a plasma generation cavity of the plasma source, the plasma generation cavity being enclosed at least in part by the one or more internal surfaces, wherein:
        the one or more internal surfaces are substantially planar, perforated surfaces that face one another across the plasma generation cavity,
        the plasma generation cavity is bounded by the substantially planar, perforated surfaces and an insulator comprising a ceramic ring that is disposed against a periphery of each of the substantially planar, perforated surfaces, the ceramic ring forming an optical port, and
        flowing the one or more first source gases comprises flowing the first source gases through perforations in an upstream one of the internal surfaces;
    transmitting power into the plasma generation cavity by utilizing the internal surfaces as electrodes across which radio frequency (RF) power is connected, to generate a first plasma, wherein:
        the one or more first source gases ignite to form the first plasma, producing first plasma products, and
        portions of the first plasma products adhere to the one or more internal surfaces;
    flowing the first plasma products out of the plasma generation cavity by flowing the plasma products through perforations in a downstream one of the internal surfaces, toward a process chamber where a workpiece is processed by the first plasma products;
    flowing one or more second source gases into the plasma generation cavity;
    transmitting power into the plasma generation cavity to generate a second plasma, wherein
        the one or more second source gases ignite to form the second plasma, producing second plasma products; and
        the second plasma products at least partially remove the portions of the first plasma products from the one or more internal surfaces;
    capturing optical emissions from at least one of the first plasma and the second plasma through the optical port as an optical signal in a fiber optic;
    delivering the optical signal through the fiber optic to an optical emission spectrometer; and
    identifying emission peaks with the optical emission spectrometer to monitor the conditioning of the internal surfaces.

2. The method of claim 1, further comprising:
    performing sequential repetitions of the steps of flowing the one or more first source gases, transmitting the power into the plasma generation cavity to generate the first plasma, flowing the one or more second source gases, and transmitting the power into the plasma generation cavity to generate the second plasma; and
    adjusting a parameter of the second plasma based on the emission peaks, to improve consistency of the first plasma on the next repetition.

3. The method of claim 2, wherein adjusting the parameter of the second plasma comprises adjusting one or more of
    a power level transmitted into the plasma generation cavity;
    concentration of one or more of the second source gases;
    a pressure of the second plasma; and
    time during which the power is transmitted into the plasma generation cavity to generate the second plasma.

4. The method of claim 1, wherein:
    the one or more internal surfaces comprise yttria;
    the workpiece comprises silicon;
    the workpiece is processed by the first plasma products etching the silicon;

flowing the one or more first source gases comprises flowing at least NF$_3$ and H$_2$ as the first source gases;

the portion of the plasma products that adhere to the one or more internal surfaces include H radicals that adhere to the yttria;

flowing the one or more second source gases comprises flowing at least a fluorine-containing gas as the second source gas; and the second plasma products include F radicals that remove at least some of the H radicals from the yttria.

5. The method of claim 4, wherein the workpiece is a semiconductor wafer, and further comprising:

loading the wafer into the process chamber before flowing the first source gases; and unloading the wafer from the process chamber before flowing the second source gases.

6. The method of claim 1, wherein:

the one or more internal surfaces comprise yttria;

the workpiece comprises silicon nitride;

the workpiece is processed by the first plasma products etching the silicon nitride;

flowing the one or more first source gases comprises flowing at least NF$_3$ as the first source gas;

the portion of the plasma products that adhere to the one or more internal surfaces include F radicals that adhere to the yttria;

flowing the one or more second source gases comprises flowing at least a hydrogen-containing gas as the second source gas; and the second plasma products include H radicals that remove at least some of the F radicals from the yttria.

7. The method of claim 6, wherein the workpiece is a semiconductor wafer, and further comprising:

loading the wafer into the process chamber before flowing the first source gases; and unloading the wafer from the process chamber before flowing the second source gases.

8. The method of claim 6, wherein the workpiece is a semiconductor wafer, and further comprising:

loading the wafer into the process chamber before flowing the first source gases; and flowing the second source gases and transmitting the power into the plasma generation cavity to generate the second plasma before unloading the wafer from the process chamber.

9. A method of maintaining stability of a process attribute of a plasma processing system that etches material from wafers, comprising:

generating an etch plasma from first source gases within a plasma generation cavity of the plasma processing system to create etch plasma products, wherein:

one or more internal surfaces of the plasma generation cavity are substantially planar, perforated surfaces that face one another across the plasma generation cavity, the plasma generation cavity being:

upstream from a process chamber that processes the wafers and bounded by the substantially planar, perforated surfaces and an insulator comprising a ceramic ring that is disposed against a periphery of each of the substantially planar, perforated surfaces, the ceramic ring forming an optical port therein, and wherein:

generating the etch plasma comprises flowing the first source gases through perforations in an upstream one of the planar, perforated surfaces and transmitting power into the plasma generation cavity by connecting radio frequency (RF) power across the planar, perforated surfaces; and a first portion of the etch plasma products adheres to the one or more internal surfaces of the plasma processing system;

flowing at least a second portion of the etch plasma products through a downstream one of the planar, perforated surfaces to the process chamber, using the second portion of the etch plasma products to etch the material from one of the wafers, wherein the portions of the etch plasma products adhered to the one or more internal surfaces affect the process attribute;

generating a conditioning plasma from second source gases within the plasma generation cavity of the plasma processing system to create conditioning plasma products, wherein the conditioning plasma products remove at least some of the etch plasma products adhered to the one or more internal surfaces;

capturing an optical signal through the optical port, the optical signal being representative of an amount of the etch plasma products adhered to the one or more internal surfaces, from one of the etch plasma and the conditioning plasma;

delivering the optical signal through a fiber optic to an optical emission spectrometer, and identifying emission peaks in the optical signal with the optical emission spectrometer to monitor the process attribute.

10. The method of claim 9, further comprising loading one of the wafers into the plasma processing system before generating the etch plasma, and unloading the one of the wafers from the plasma processing system before generating the conditioning plasma.

11. The method of claim 9, further comprising repeating generating the etch plasma, using the etch plasma products to etch the material, and generating the conditioning plasma;

and adjusting a parameter of the conditioning plasma based on the emission peaks in one repetition of the conditioning plasma, to correct variations in the amount of the etch plasma products adhered to the internal surfaces for a subsequent repetition of the etch plasma.

12. The method of claim 9, wherein the material is polysilicon, the process stability being maintained is etch rate of the polysilicon, generating the etch plasma comprises generating H radicals, and generating the conditioning plasma comprises generating F radicals.

13. The method of claim 9, wherein the material is silicon nitride, the process stability being maintained is selectivity of the etch to silicon nitride over silicon dioxide, generating the etch plasma comprises generating F radicals, and generating the conditioning plasma comprises generating H radicals.

14. The method of claim 11, wherein adjusting a parameter of the conditioning plasma comprises adjusting one or more of:

a power level transmitted into the plasma generation cavity;

concentration of one or more of the second source gases;

a pressure of the conditioning plasma; and time during which the power is transmitted into the plasma generation cavity to generate the conditioning plasma.

15. The method of claim 12, wherein the one or more internal surfaces comprise yttria;

generating the etch plasma from the first source gases comprises flowing at least NF$_3$ and H$_2$ as the first source gases;

the first portion of the plasma products that adheres to the one or more internal surfaces includes H radicals that adhere to the yttria;

generating the conditioning plasma from the second source gases comprises flowing at least a fluorine-containing gas as the second source gas; and the conditioning plasma products include F radicals that remove at least some of the H radicals from the yttria.

16. The method of claim 13, wherein the one or more internal surfaces comprise yttria;

generating the etch plasma from the first source gases comprises flowing at least $NF_3$ as the first source gases;

the first portion of the plasma products that adheres to the one or more internal surfaces includes F radicals that adhere to the yttria;

generating the conditioning plasma from the second source gases comprises flowing at least a hydrogen-containing gas as the second source gas; and the conditioning plasma products include H radicals that remove at least some of the F radicals from the yttria.

17. The method of claim 16, further comprising loading one of the wafers into the plasma processing system before generating the etch plasma, and generating the conditioning plasma before unloading the one of the wafers from the plasma processing system.

* * * * *